United States Patent
Lai et al.

(10) Patent No.: US 8,402,204 B2
(45) Date of Patent: *Mar. 19, 2013

(54) METHODS FOR MEASURING USABLE LIFESPAN AND REPLACING AN IN-SYSTEM PROGRAMMING CODE OF A MEMORY DEVICE, AND DATA STORAGE SYSTEM USING THE SAME

(75) Inventors: De-Wei Lai, Hsinchu (TW); Jen-Hung Liao, Taichung (TW); Hsiao-Te Chang, Jhubei (TW)

(73) Assignee: Silicon Motion, Inc., Jhubei (TW)

( * ) Notice: Subject to any disclaimer, the term of this patent is extended or adjusted under 35 U.S.C. 154(b) by 390 days.

This patent is subject to a terminal disclaimer.

(21) Appl. No.: 12/718,984

(22) Filed: Mar. 7, 2010

(65) Prior Publication Data
US 2011/0119430 A1    May 19, 2011

(30) Foreign Application Priority Data
Nov. 13, 2009  (TW) ............................... 98138588 A

(51) Int. Cl.
G06F 12/00 (2006.01)
(52) U.S. Cl. ......... 711/103; 711/154; 711/165; 711/170
(58) Field of Classification Search .................. 711/103, 711/154, 165, 170
See application file for complete search history.

(56) References Cited

U.S. PATENT DOCUMENTS

| | | | | |
|---|---|---|---|---|
| 6,000,006 A | * | 12/1999 | Bruce et al. | 711/103 |
| 6,230,233 B1 | * | 5/2001 | Lofgren et al. | 711/103 |
| 6,584,559 B1 | * | 6/2003 | Huh et al. | 713/2 |
| 2002/0095619 A1 | * | 7/2002 | Marsh | 714/23 |
| 2003/0161199 A1 | | 8/2003 | Estakhri | |
| 2003/0227804 A1 | | 12/2003 | Lofgren et al. | |
| 2004/0177212 A1 | * | 9/2004 | Chang et al. | 711/103 |
| 2006/0031666 A1 | * | 2/2006 | Yasuda | 713/2 |
| 2007/0266200 A1 | * | 11/2007 | Gorobets et al. | 711/103 |

FOREIGN PATENT DOCUMENTS

CN    101046771 A    10/2007

OTHER PUBLICATIONS

Office Action of U.S. Appl. No. 12/434,671, issued on Sep. 19, 2011.

* cited by examiner

*Primary Examiner* — Arpan P. Savla
(74) *Attorney, Agent, or Firm* — Wang Law Firm, Inc.; Li K. Wang; Stephen Hsu

(57) ABSTRACT

A data storage system comprises a host and a flash memory device having a non-non-volatile memory. A controller of the flash memory device calculates an average erase count of the flash memory to obtaining a remaining period of time indicating usable lifespan of the flash memory device. The host obtains an index by comparing the average erase count with a first threshold and determines a performance capability status for the flash memory device. The performance capability status is set to a first status when the average erase count exceeds the first threshold. The host generates an indication based on the performance capability status and performs a limp function responsive to the first status. The limp function loads a predetermined in-system programming code for replacing an original one to configure a minimum number of at least some spare blocks of the flash memory reserved and used for data update operations.

20 Claims, 4 Drawing Sheets

METHODS FOR MEASURING USABLE LIFESPAN AND REPLACING AN IN-SYSTEM PROGRAMMING CODE OF A MEMORY DEVICE, AND DATA STORAGE SYSTEM USING THE SAME

CROSS REFERENCE TO RELATED APPLICATIONS

This application claims priority of Taiwan Patent Application No. 098138588, filed on Nov. 13, 2009, the entirety of which is incorporated by reference herein.

BACKGROUND OF THE INVENTION

1. Field of the Invention

The invention relates to non-volatile memories, and more particularly to usable lifespan measurement, performance capability estimation and in-system programming code replacement of the non-volatile memories, and data storage systems using the same system.

2. Description of the Related Art

A non-volatile memory that can retain stored information without power supply, such as a flash memory, is commonly used in a variety of consumer electronic devices, including mobile phones, digital cameras, personal digital assistants (PDAs) and so on. In general, the non-volatile memory is well suited for consumer electronic devices for its small size, high memory density, low power consumption and low cost features. Thus, the non-volatile memory, e.g., an NAND flash, may be packaged into different storage media, such as a compact flash (CF) card, multimedia card (MMC), secure digital (SD) card, and solid state disks (SSD), etc.

Generally, non-volatile memory, such as a flash memory, is formed by a large number of blocks each comprises a plurality of pages for data storage. Further, the flash memory is programmed by a unit of a page and erased by a unit of a block. When a block which has stored data therein attempts to update the stored data, the used block must be erased before being re-used or updated. This is because data can only be written into a page where no data is stored or to a page which has been erased, and the flash memory cannot be erased by a unit of a page.

However, each of the erasable blocks has a limited number of erase cycles; this causes the non-volatile memory to have a limited useable lifespan. As time passes, the usable lifespan of the non-volatile memory becomes exhausted and it may no longer be programmed or erased properly so as to degrade the entire performance capability of the non-volatile memory.

Therefore, it is desirable to provide a real-time update of the usable lifespan and performance capability for the non-volatile memory. In addition, it is desirable to give prompt notification of a situation where the usable lifespan is about to expire or when the performance capability degradation becomes critical, so that appropriate actions can be taken in advance, such as replacing the in-system programming code of the non-volatile memory or backing up data stored thereon.

BRIEF SUMMARY OF THE INVENTION

The invention provides a data storage system comprising a memory device and a host. The memory device comprises a non-volatile memory and a controller. The non-volatile memory comprises a plurality of physical blocks having a plurality of data blocks and a plurality of spare blocks. The data blocks are used for storing data and at least some spare blocks corresponding to the data blocks are reserved and used for data update operations. The controller is coupled to the non-volatile memory for calculating an average erase count of selected physical blocks, and obtaining a remaining period of time indicative of usable lifespan of the memory device according to the average erase count and a maximum allowable number of cycles for erasing each physical block. The host is coupled to the memory device for obtaining an index by comparing the average erase count with a first threshold, determining a performance capability status for the memory device according to the index, setting the performance capability status to a first status when the average erase count exceeds the first threshold and the total number of spare blocks other than the at least some spare blocks corresponding to the data blocks reserved and used for data update operations is below a lower limit, generating an indication based on the performance capability status, and performing a limp function in response to the first status for loading a predetermined in-system programming (ISP) code to replace an original in-system programming code being stored in at least one physical block of the non-volatile memory. The limp function in the non-volatile memory configures a minimum number of the at least some spare blocks reserved and used for data update operations.

In addition, the invention provides a method for measuring usable lifespan of a memory device. According to an embodiment, the memory device is a non-volatile memory having a plurality of physical blocks. The method comprises the steps of: accumulating a total erase count of selected physical blocks over a predetermined time period; calculating an average erase count of the selected physical blocks according to the total erase count and the predetermined time period; and obtaining a remaining period of time indicative of the usable lifespan of the memory device according to the average erase count and a maximum allowable number of cycles for erasing each physical block.

In addition, the invention provides a method for replacing an in-system programming code of a memory device. According to an embodiment, the memory device comprises a non-volatile memory and a controller. The method comprises the steps of: determining whether an original in-system programming code of the memory device is to be replaced, wherein at least one physical block of the non-volatile memory is allocated for storing the original in-system programming code; acquiring a setup file having a predetermined in-system programming code; storing the predetermined in-system programming code into a random access memory residing on the controller; reading out the stored predetermined in-system programming code from the random access memory for a first verification; replacing the original in-system programming code stored in the at least one physical block with the predetermined in-system programming code when the first verification succeeds; and reading out the stored predetermined in-system programming code from the at least one physical block for a second verification.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limited sense. The scope of the invention is best determined by reference to the appended claims.

Figure 1:
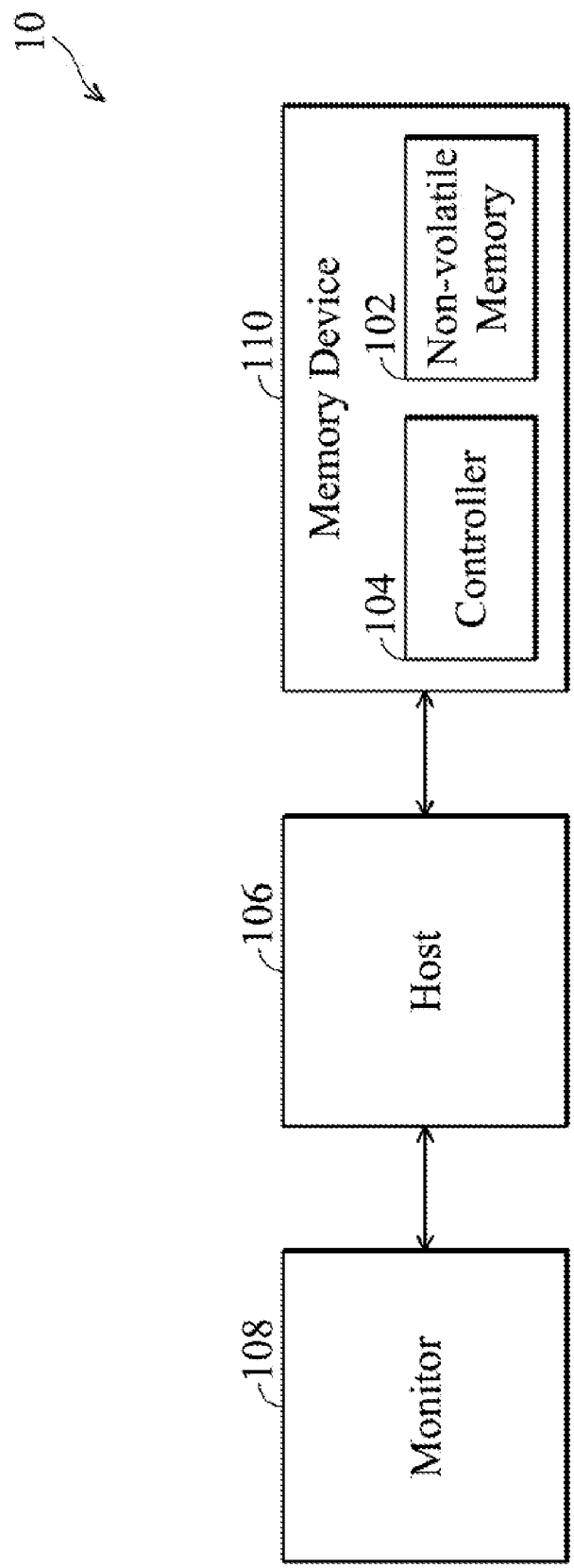
FIG. 1 is a block diagram illustrating a data storage system according to an embodiment of the invention.

FIG. 1 is a block diagram illustrating a data storage system 10 according to an embodiment of the invention.

The data storage system 10 comprises a memory device 110, a host 106 and a monitor 108. The memory device 110 comprises a controller 104 and a non-volatile memory 102, e.g., an NAND flash memory.

According to an embodiment, the non-volatile memory 102 comprises a plurality of physical blocks. The physical blocks comprise a plurality of data blocks, a plurality of spare blocks and a plurality of defective blocks. For example, when the non-volatile memory 102 is first used, it may contain physical blocks of (X+Y+Z). It is noted that X represents a total number of data blocks, Y represents a total number of spare blocks, and Z represents a total number of defective blocks. The data blocks are used for storing data. The defective blocks inhibit erasing or programming access. Further, at least some spare blocks corresponding to the data blocks are reserved and used for data update operations and the remaining spare blocks other than the at least some spare blocks reserved and used for data update operations are used for maintaining performance capability of the non-volatile memory 102. For example, the remaining spare blocks may be provided to replace bad or defective blocks during read or write operations. The defective blocks may be generated during manufacturing or due to excessive erase operations performed thereon. Generally, Z is much smaller than X or Y in the beginning. But as erase operations performed on the non-volatile memory 102 for data writing increases and an erase count of each physical block is limited, more and more data blocks or spare blocks may become defective blocks due to excessive erase operations.

In such a case, when a spare block is defective due to excessive erase operations, the spare block is marked as a defective block. Thus, the total number of spare blocks becomes (Y−1) and the total number of defective blocks becomes (Z+1). In another case, when a data block is defective, a corresponding spare block is used as the data block to maintain the size of the data blocks. Thus, the total number of data blocks remains at X, while the total number of spare blocks becomes (Y−1) and the total number of defective blocks becomes (Z+1).

Accordingly, when the total number of defective blocks is increased to a high level, a performance capability issue or data lost of the non-volatile memory 102 may occur due to insufficient spare blocks. In this case, some conditions of the non-volatile memory 102 may be utilized to obtain an index for determining whether the performance capability of the non-volatile memory 102 is adequate. For example, the host 106 may determine the usable lifespan or the performance capability status of the non-volatile memory 102, i.e., the memory device 110, according to the initial defective blocks, current defective blocks, initial spare blocks, current spare blocks, an erase count of all or several physical blocks, or other conditions of the non-volatile memory 102.

Figure 2:
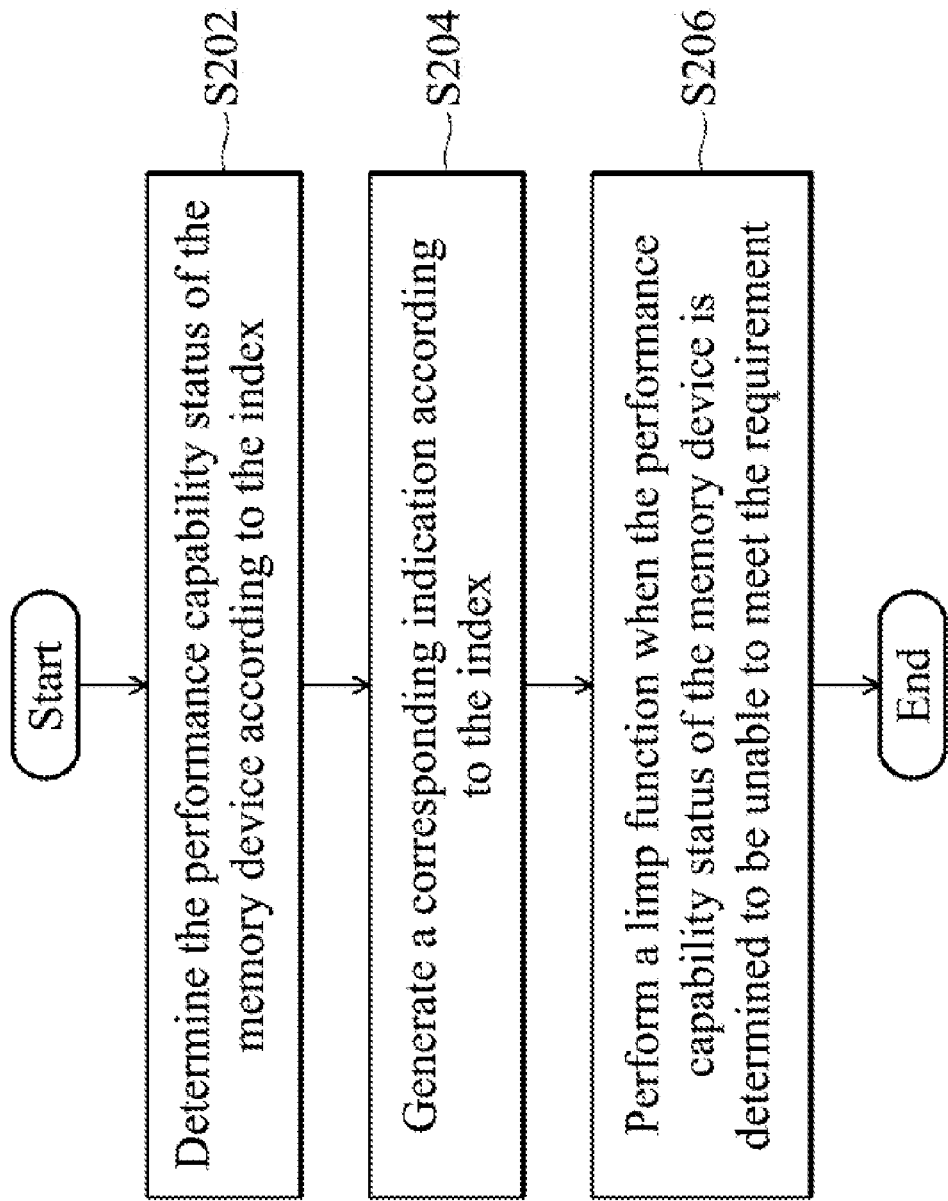
FIG. 2 is a flowchart illustrating a method for operating a memory device according to an embodiment of the invention.

FIG. 2 is a flowchart illustrating a method for operating a memory device according to an embodiment of the invention. As shown in FIGS. 1 and 2, when the data storage system 10 incorporated with storage media (e.g., the memory device 110) is powered on, one or more of the aforementioned conditions are provided to the host 106 to obtain the index, so as to determine the performance capability status of the memory device 110 (step S202).

According to an embodiment, in the memory device 110, the controller 104 coupled to the non-volatile memory 102 obtains the average erase count of the selected physical blocks for determining the performance capability status of the non-volatile memory 102. During operation, the controller 104 calculates the average erase count according to a total erase count of the selected physical blocks being accumulated over a predetermined time period.

It is noted that the beginning of the predetermined time period is determined by a first execution of an application program for indicating a first erase operation or access operation performed on the non-volatile memory 102.

For example, it is assumed that a predetermined time has elapsed after the first execution of the application program on the memory device 110. The controller 104 first obtains the erase count of each selected physical blocks and then accumulates a total erase count, so as to calculate the average erase count of the selected physical blocks. Further, the application program may be executed at every fixed time interval for updating the accumulated total erase count and the predetermined time period.

In this case, the host 106 coupled to the memory device 110 obtains the index corresponding to the average erase count of the selected physical blocks. In an embodiment, the average erase count is obtained by averaging the total erase count of the selected physical count. During operation, the host 106 compares the average erase count with a first threshold. Then, a corresponding indication is generated according to the index (step S204). As shown in FIG. 1, the monitor 108 is coupled to the host 106 for displaying the corresponding indication.

Further, when the performance capability status of the memory device 110 is determined to be unable to meet the requirement, the host 106 performs a limp function for extending the usable lifespan of the memory device 110. For example, based on the performance requirements, the limp function loads an in-system programming code from the non-volatile memory 102 into the controller 104, so as to maintain normal read or write operations of the non-volatile memory 102 (step S206). The operation of the limp function is illustrated below in details with reference to FIG. 3.

Figure 3:
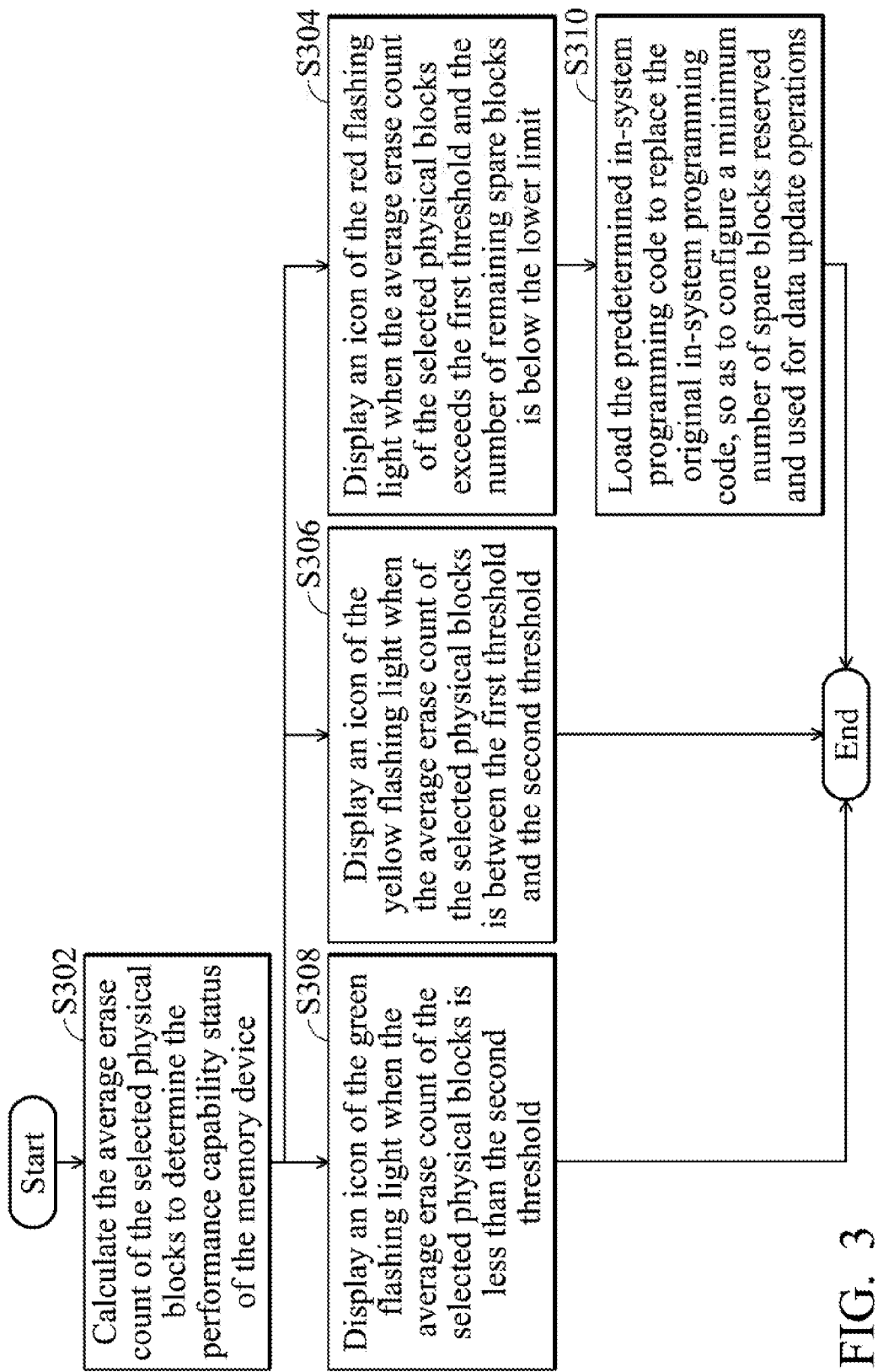
FIG. 3 is a flowchart illustrating a method for operating a memory device according to another embodiment of the invention.

FIG. 3 is flowchart illustrating a method for operating the memory device 110 according to the embodiment of FIG. 2. In this embodiment, the index is obtained according to the average erase count of the selected physical blocks in the non-volatile memory 102 (as shown in FIG. 1) for determining the performance capability status of the memory device 110.

For example, when the host 106 attempts to write data into a physical block B1 having an erase count C1, it is necessary for the controller 104 as shown in FIG. 1 to erase the physical block B1. Thus, the erase count of the physical block B1 is determined to be (C1+1). In this way, the host 106 selects some physical blocks to calculate the average erase count and then determine the performance capability status of the memory device 110 (step S302). Moreover, the controller 104 may obtain a remaining time period according to the average erase count and a maximum allowable number of cycles for erasing each physical block. The remaining time period is then displayed on the monitor 108 for indicating the usable lifespan of the memory device 110.

Afterwards, the host 106 obtains the index by comparing the average erase count with a first threshold. Specifically, the host 106 determines the performance capability status according to the index. After the performance capability status is determined, the corresponding indication is generated according to the performance capability status.

According to an embodiment, when the average erase count exceeds the first threshold and the number of remaining spare blocks other than the spare blocks reserved and used for data update operations is below a lower limit, the performance capability status is set to a first status for indicating that the non-volatile memory 102 is prone to be defective and the data stored in the non-volatile memory 102 may be lost in the near future. For example, it is assumed that Y represents the number of the whole spare blocks and N represents the total number of spare blocks reserved and used for data update operations, thus the number of usable remaining spare blocks is determined to be (Y-N). It is noted that, instead of the average erase counts and the number of the remaining spare blocks, other conditions may be built or combined to obtain the index and determine the performance capability status of the memory device 110. As such, in response to the first status, the indication may be displayed by a flashing light signal of a red color on the monitor 108, such as an icon of the red flashing light, so as to inform end users to perform a backup operation on the non-volatile memory 102 as soon as possible for preventing data loss (step S304). For example, during the backup operation, the host 106 then instructs the controller 104 to backup stored data of the non-volatile memory 102.

Furthermore, in response to the flashing light signal of the red color or the first status, the host 106 executes a limp function to extend the usable lifespan of the memory device 110. According to an embodiment, the end users may click the icon of the red flashing light on the monitor 108, so as to make the data storage system 10 execute the limp function. The limp function loads a predetermined in-system programming code for replacing an original in-system programming code being stored in the at least one physical block of the non-volatile memory 102. The replacement process of the in-system programming code is illustrated below in details with reference to FIG. 4.

According to an embodiment, the predetermined in-system programming code loaded by the limp function configures a minimum number of spare blocks reserved and used for data update operations (step S310). During operation, the spare blocks reserved and used for data update operations with original data blocks are so-called pair blocks and thus the minimum number of spare blocks indicates the minimum number of pair blocks. More specifically, the minimum number of spare blocks is able to maintain normal operations of the memory device 110, but may affect performance capability of the memory device 110. For example, corresponding to the data blocks, it is assumed that N represents the number of spare blocks which are originally reserved and used for data update operations, then the limp function may decrease N to a minimum number of M that allows the controller 104 to maintain normal operations (step S310).

Moreover, assuming the total number of spare blocks is Y, after the limp function is performed, then the number of spare blocks available for replacing any defective data blocks or any defective spare blocks is (Y-M). That is, more free spare blocks are emptied to replace bad or defective blocks, thereby achieving increased usable lifespan of the memory device 110 and providing the end users more time to back up the stored data of the non-volatile memory 102 before data is lost.

According to another embodiment, the limp function loads the predetermined in-system programming code to configure the non-volatile memory 102 to run at a slower clock speed, thereby maintaining normal read or write operations of the non-volatile memory 102.

Additionally, when the average erase count is below the first threshold, the host 106 further obtains the index by comparing the average erase count with a second threshold. In this case, the indication is then displayed by two flashing light signals alternating between a yellow color and a green color based on the compared result of the average erase count and the second threshold. That is, when the average erase count is between the first threshold and the second threshold, the indication is displayed by the flashing light signal of a yellow color on the monitor 108, such as an icon of the yellow flashing light, which indicates that the memory device 110 has been used for a while and the performance capability thereof has deteriorated (step S306). When the average erase count is less than the second threshold, the indication is displayed by the flashing light signal of a green color on the monitor 108, such as an icon of the green flashing light, indicating that the performance capability of the memory device 110 is adequate (step S308).

It is noted that the first threshold and the second threshold are programmable. During operation, the first threshold and the second threshold may be determined according to the memory type of the non-volatile memory 102. For example, the first threshold and the second threshold may be obtained from a look-up table according to a flash ID or a flash vendor specification of the non-volatile memory 102. Alternatively, the end users may program the first threshold and the second threshold according to experiences or requirements, so as to set up a more appropriate indication.

It is noted that the memory device 110 may comprise a compact flash (CF) card, multimedia card (MMC), secure digital (SD) card, and solid state disks (SSD), and other memory devices associated with the non-volatile memory.

Figure 4:
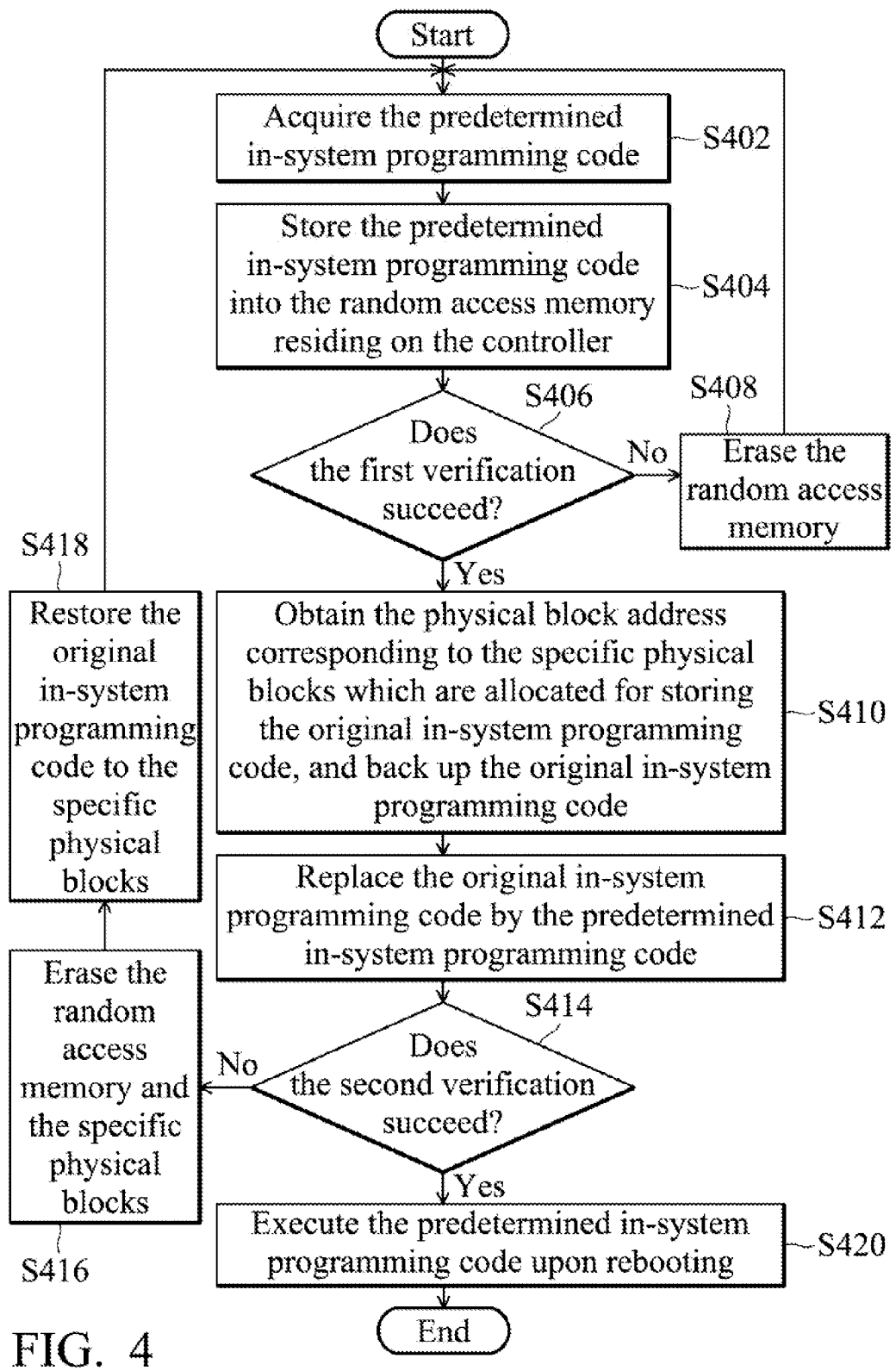
FIG. 4 is a flowchart illustrating a method for replacing an in-system programming code according to an embodiment of the invention.

FIG. 4 is a flowchart illustrating a method for replacing an in-system programming code according to an embodiment of the invention.

From the aforementioned description, when the usable lifespan of the memory device 110 is about to expire, or performance capability or data loss is about to ensue, according to an embodiment, the flashing light signal of the red color may be provided to remind the end users to back up the stored data of the non-volatile memory 102. Further, the original in-system programming code being stored in the non-volatile memory 102 may also be replaced to extend the usable lifespan of the memory device 110.

Moreover, when the manufacturers provide a new version of in-system programming code to the end users for update, the end users may connect to the web site of the manufacturers via the internet, and then replace the original in-system programming code being stored in the non-volatile memory 102 with the new version of in-system programming code. Alternatively, a setup file containing the new version of in-system programming code may be acquired by downloading the file from the web site. The replacement of the in-system programming code is then achieved by appropriate decompression or installation operations.

Specifically, when the host 106 connects to an external internet or an extra memory, the controller 104 may issue a command SMART_1 to the host 106. The host 106 then acquires a setup file having a predetermined in-system programming code via the internet or the extra memory, so as to transmit the setup file to the controller 104 (step S402). Following this, the controller 104 stores the predetermined in-system programming code into a random access memory (not shown) residing on the controller 104 (step S404).

Next, the controller 104 issues a command SMART_2 to compare the stored predetermined in-system programming code from the random access memory with the predetermined in-system programming code stored in the setup file for a first verification (step S406).

When the first verification fails, it indicates that acquiring the setup file or storing the predetermined programming code may encounter errors. In this case, the controller 104 issues an erase command SMART_C1 to erase the stored predetermined in-system programming code in the random access memory (step S408).

When the first verification succeeds, the controller 104 issues a command SMART_3 for obtaining a physical block address (PBA) corresponding to specific physical blocks which are allocated for storing the original in-system programming code, such as PBA3 and PBA4 of the non-volatile memory 102. Subsequently, the original in-system programming code stored in the specific physical blocks is read out so that it can be backed up to a backup storage location of the non-volatile memory 102 (step S410).

Upon completion of the backup, the specific physical blocks are then erased. Next, the predetermined in-system programming code is written into the specific physical blocks, such as PBA3 and PBA4, for replacing the original in-system programming code (step S412).

Further, the controller 104 issues a command SMART_4 for reading out the stored predetermined programming code from the specific physical blocks such as PBA3 and PBA4 to compare with the predetermined in-system programming code stored in the setup file for a second verification (step S414).

When the second verification fails, it indicates that writing the predetermined in-system programming code into the specific physical blocks, such as PBA3 and PBA4, may encounter errors. In this case, the controller 104 may issue another command SMART_C2 for erasing the stored predetermined in-system programming code in the random access memory, as well as erasing the predetermined in-system programming code stored the specific physical blocks, such as PBA3 and PBA4 (step S416). Then, the original in-system programming code in the backup storage location is restored to the specific physical blocks, such as PBA3 and PBA4 (step S418).

When the second verification succeeds, the predetermined in-system programming code of the non-volatile memory 102 may be executed upon rebooting the memory device 110 (step S420).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A data storage system, comprising:
    a memory device, comprising:
        a non-volatile memory, comprising a plurality of physical blocks having a plurality of data blocks and a plurality of spare blocks, wherein the data blocks are used for storing data and at least some spare blocks corresponding to the data blocks are reserved and used for data update operations; and
        a controller coupled to the non-volatile memory for calculating an average erase count of selected physical blocks, and obtaining a remaining period of time indicative of usable lifespan of the memory device according to the average erase count and a maximum allowable number of cycles for erasing each physical block; and
    a host coupled to the memory device for obtaining an index by comparing the average erase count with a first threshold, determining a performance capability status for the memory device according to the index, setting the performance capability status to a first status when the average erase count exceeds the first threshold and the total number of spare blocks other than the at least some spare blocks corresponding to the data blocks reserved and used for data update operations is below a lower limit, generating an indication based on the performance capability status, and performing a limp function in response to the first status for loading a predetermined in-system programming (ISP) code to replace an original in-system programming code being stored in at least one physical block of the non-volatile memory,
    wherein the predetermined in-system programming code configures a minimum number of the at least some spare blocks reserved and used for data update operations.

2. The data storage system as claimed in claim 1, further comprising:
    a monitor coupled to the host for displaying the indication and the remaining period of time.

3. The data storage system as claimed in claim 1, wherein the average erase count is calculated according to a total erase count of the selected physical blocks being accumulated over a predetermined time period.

4. The data storage system as claimed in claim 3, wherein the beginning of the predetermined time period is determined by a first execution of an application program indicative of a first erase operation performed on the non-volatile memory.

5. The data storage system as claimed in claim 1, wherein the indication is displayed by a flashing light signal of a red color in response to the first status.

6. The data storage system as claimed in claim 1, wherein, the host obtains the index by comparing the average erase count with a second threshold when the average erase count is below the first threshold.

7. The data storage system as claimed in claim 6, herein the indication is displayed by two flashing light signals alternating between a yellow color and a green color based on the compared result of the average erase count and the second threshold.

8. The data storage system as claimed in claim 1, wherein when the host transmits a setup file having the predetermined in-system programming code to the controller, the controller stores the predetermined in-system programming code into a random access memory residing thereon, reads out the stored predetermined in-system programming code from the random access memory for a first verification;
    replaces the original in-system programming code stored in the at least one physical block with the predetermined in-system programming code when the first verification succeeds; and reads out the stored predetermined in-system programming code from the at least one physical block for a second verification.

9. The data storage system as claimed in claim 8, wherein when the second verification succeeds, the controller executes the predetermined in-system programming code of the non-volatile memory upon rebooting the memory device.

10. The data storage system as claimed in claim 8, wherein the controller replaces the original in-system programming code by reading the at least one physical block for backup of the original in-system programming code to a backup storage location of the non-volatile memory, erasing the at least one physical block, and writing the predetermined in-system programming code into the at least one physical block.

11. The data storage system as claimed in claim 8, wherein when the first verification fails, the controller erases the stored predetermined in-system programming code in the random access memory.

12. The data storage system as claimed in claim 8, wherein when the second verification fails, the controller erases the stored predetermined in-system programming code in the random access memory, erases at least one physical block, and restores the backup of the original in-system programming code from the backup storage location to the at least one physical block.

13. A method for measuring usable lifespan of a memory device, wherein the memory device comprises a non-volatile memory having a plurality of physical blocks, comprising:
    accumulating a total erase count of selected physical blocks over a predetermined time period;
    calculating an average erase count of the selected physical blocks according to the total erase count and the predetermined time period; and
    obtaining a remaining period of time indicative of the usable lifespan of the memory device according to the average erase count and a maximum allowable number of cycles for erasing each physical block;
    obtaining an index by comparing the average erase count with a first threshold;
    determining a performance capability status for the memory device according to the index and setting the performance capability status to a first status when the average erase count exceeds the first threshold and a total number of spare blocks other than at least some spare blocks corresponding to data blocks reserved and used for data update operations is below a lower limit;
    generating an indication based on the performance capability status; and
    performing a limp function in response to the first status for loading a predetermined in-system programming (ISP) code to replace an original in-system programming code being stored in at least one physical block of the non-volatile memory, wherein the predetermined in-system programming code configures a minimum number of the at least some spare blocks reserved and used for data update operations.

14. The method as claimed in claim 13, wherein the beginning of the predetermined time period is determined by a first execution of an application program indicative of the first erase operation performed on the non-volatile memory.

15. The method as claimed in claim 14, further comprising:
    executing the application program at every fixed time interval for updating the accumulated total erase count and the predetermined time period.

16. The method as claimed in claim 13, further comprising:
    determining whether the original in-system programming code of the memory device is to be replaced, wherein the at least one physical block of the non-volatile memory is allocated for storing the original in-system programming code;
    acquiring a setup file having the predetermined in-system programming code;
    storing the predetermined in-system programming code into a random access memory residing on the controller,
    reading out the stored predetermined in-system programming code from the random access memory for a first verification;
    replacing the original in-system programming code stored in the at least one physical block with the predetermined in-system programming code when the first verification succeeds; and
    reading out the stored predetermined in-system programming code from the at least one physical block for a second verification.

17. The method as claimed in claim 16, further comprising:
    executing the predetermined in-system programming code of the non-volatile memory upon rebooting the memory device when the second verification succeeds.

18. The method as claimed in claim 16, wherein the step of replacing the original in-system programming code comprises:
    reading the at least one physical block for backup of the original in-system programming code to a backup storage location of the non-volatile memory;
    erasing the at least one physical block; and
    writing the predetermined in-system programming code into the at least one physical block.

19. The method as claimed in claim 16, further comprising:
    erasing the stored predetermined in-system programming code in the random access memory when the first verification fails.

20. The method as claimed in claim 16, further comprising:
    erasing the stored predetermined in-system programming code in the random access memory when the second verification fails;
    erasing the at least one physical block; and
    restoring the backup of the original in-system programming code from the backup storage location to the at least one physical block.

* * * * *